United States Patent
Ardehali

(10) Patent No.: US 8,390,371 B2
(45) Date of Patent: Mar. 5, 2013

(54) TUNABLE TRANSCONDUCTANCE-CAPACITANCE FILTER WITH COEFFICIENTS INDEPENDENT OF VARIATIONS IN PROCESS CORNER, TEMPERATURE, AND INPUT SUPPLY VOLTAGE

(75) Inventor: Mohammad Ardehali, Newport Beach, CA (US)

(73) Assignee: TiaLinx, Inc., Newport Beach, CA (US)

( * ) Notice: Subject to any disclaimer, the term of this patent is extended or adjusted under 35 U.S.C. 154(b) by 207 days.

(21) Appl. No.: 12/848,006

(22) Filed: Jul. 30, 2010

(65) Prior Publication Data

US 2012/0025899 A1    Feb. 2, 2012

(51) Int. Cl.
*H04B 1/10*    (2006.01)

(52) U.S. Cl. .......................... 327/554; 327/552; 330/261

(58) Field of Classification Search ........... 327/552–554
See application file for complete search history.

(56) References Cited

U.S. PATENT DOCUMENTS

| | | | | |
|---|---|---|---|---|
| 4,431,971 | A | * | 2/1984 | Haque ............................ 330/253 |
| 4,502,019 | A | * | 2/1985 | Van Roermund ............. 330/261 |
| 5,440,264 | A | * | 8/1995 | Sevenhans et al. ........... 327/553 |
| 5,912,589 | A | * | 6/1999 | Khoury et al. ................. 330/261 |
| 6,239,654 | B1 | * | 5/2001 | Yamamoto ........................ 330/9 |
| 6,388,510 | B2 | | 5/2002 | Hayashi et al. |
| 7,319,731 | B2 | | 1/2008 | Wu |

* cited by examiner

*Primary Examiner* — Patrick O'Neill

(57) ABSTRACT

A transconductance-capacitance ($G_m$-C) filter of arbitrary order is provided that is biased by a bias circuit such that the $G_m$-C filter is robust to variations in process corner and temperature as well as input supply noise. The bias circuit includes a biased transistor that has a width-to-length ratio that is a factor X times larger than a corresponding transistor in the $G_m$-C filter. The biased transistor couples to ground through a switched capacitor circuit.

9 Claims, 5 Drawing Sheets

- Prior Art -

- Prior Art -

TUNABLE TRANSCONDUCTANCE-CAPACITANCE FILTER WITH COEFFICIENTS INDEPENDENT OF VARIATIONS IN PROCESS CORNER, TEMPERATURE, AND INPUT SUPPLY VOLTAGE

TECHNICAL FIELD

The present invention relates generally to filters, and more particularly to tunable transconductance-capacitance ($G_m$-C) filters.

BACKGROUND

Transconductance-capacitance ($G_m$-C) filters offer attractive performance characteristics. Thus, the use of $G_m$-C filters is widespread and pervasive in radio communications and signal processing. Analog $G_m$-C filters are constructed using operational transconductance amplifiers (OTAs). OTAs operate to translate a voltage input signal into a current output signal. An example balanced (differential output) OTA is shown in FIG. 1a. The transconductance $G_m$ for the OTA determines the $I^+$ and $I^-$ currents based upon the input voltages $V^+$ and $V^-$ according to the following equations:

$$I^+ = G_m(V^+ - V^-)$$

$$I^- = G_m(V^- - V^+)$$

Various approaches are known to construct OTAs such as using cascodes or differential architectures. A simple analog transconductance-capacitance ($G_m$-C) filter may be constructed using a single-ended OTA as shown in FIG. 1b. If a time constant $\tau$ is defined as $C_1/G_m$, then it can be shown that $V_{in}$ for this filter equals $V_{out} + \tau d(V_{out}(t))/dt$. The cutoff frequency for the resulting $G_m$-C filter will thus rely on both $G_m$ and $C_1$. But process corner variations will typically be in the range of 20% for a desired capacitance whereas a desired transconductance will have process corner variations in the range of 10%. It follows that the resulting time constant $\tau$ for such a filter will be accurate to just 30% across all the process corner variations. Moreover, transconductance values will vary significantly with temperature and the supply voltage level. In addition, input noise will introduce variations in the filter coefficients. Accordingly, it is conventional to provide some sort of tuning circuitry on $G_m$-C filters. In this fashion, a tunable $G_m$-C filter has its time constant set to some desired value with some isolation from variations in the power supply voltage, process corner, and temperature.

Although such independence is desirable, conventional tunable $G_m$-C filters are still sensitive to power supply variations and suffer from non-idealities. Accordingly, there is a need in the art for improved tunable $G_m$-C filters that are more robust to variations in process corner, power supply, and temperature.

SUMMARY

In accordance with one aspect of the invention, a transconductance-capacitance ($G_m$-C) filter is provided that includes: a plurality of operational transconductance amplifiers (OTAs), wherein a first one of the OTAs has a first transconductance and the remaining ones of the OTAs have transconductances that are proportional to the first transconductance, and a bias circuit for biasing the first transconductance to a desired value responsive to a clock frequency, the bias circuit including a switched capacitor circuit generating a resistance inversely proportional to the clock frequency, wherein the desired transconductance value is proportional to the clock frequency.

In accordance with another aspect of the invention, a transconductance-capacitance ($G_m$-C) filter is provided that includes: a plurality of operational transconductance amplifiers (OTAs), wherein each OTA includes a differential pair of transistors providing a tail current to a third transistor having a transconductance $g_m$, and a bias circuit for biasing a gate of a given one of the third transistors with a control voltage, the bias circuit including a switched capacitor circuit such that a transfer function for the $G_m$-C filter is proportional to a ratio of capacitances and is independent of process corner variations.

In accordance with yet another aspect of the invention, a bias circuit to bias the transconductance $g_m$ of a first transistor within a $G_m$-C filter is provided that includes: a second transistor having a width-to-length ratio that is a factor X larger than a width-to-length ratio of the first transistor, the second transistor coupling to ground through a switched capacitor circuit such that $g_m$ is proportional to $(1 - 1/X^{1/2})$.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 2:
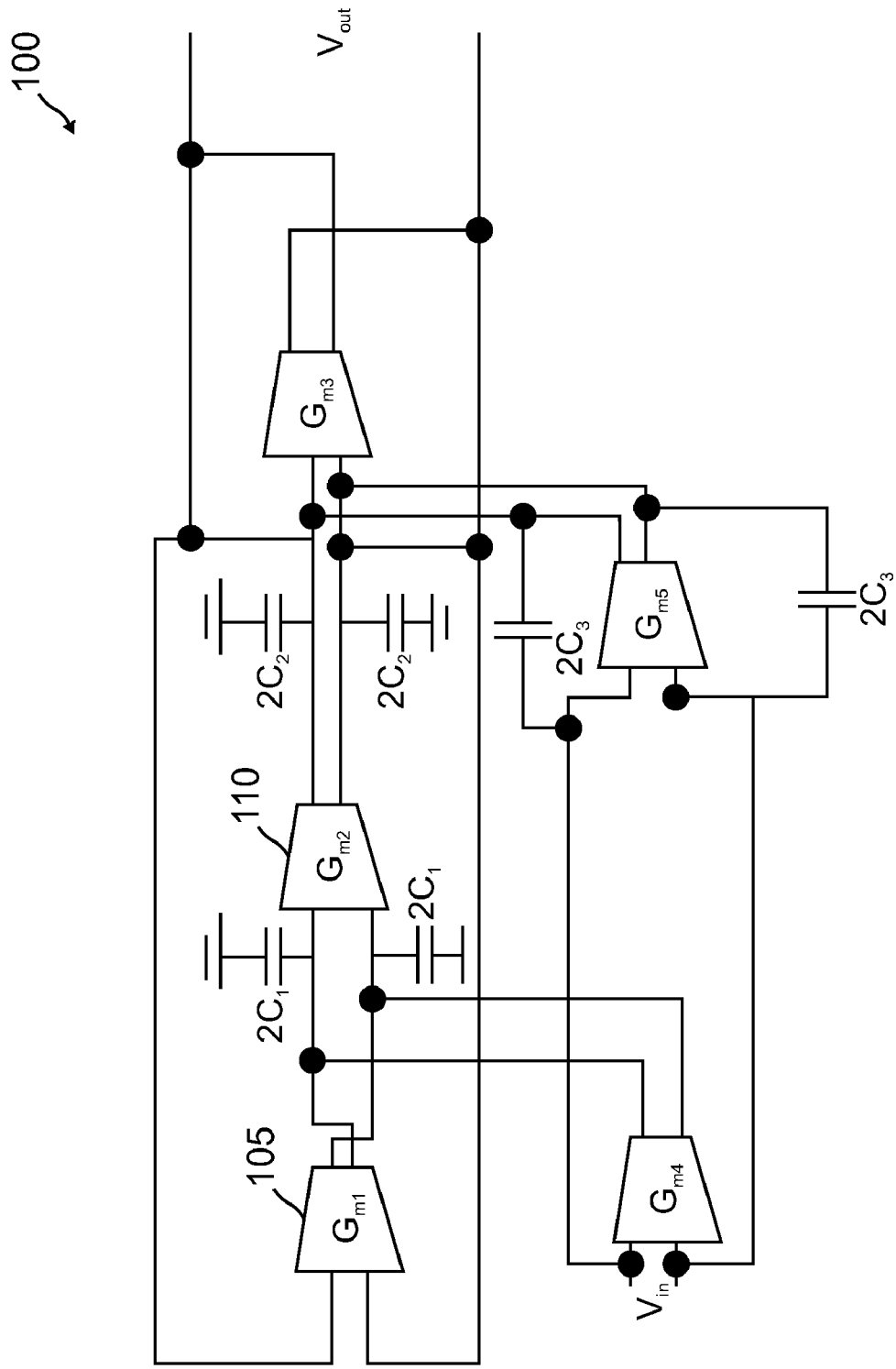
FIG. 2 is a schematic diagram of a biquad $G_m$-C filter tuned using a switched-capacitor bias circuit.

To provide a tunable $G_m$-C filter that self-compensates with regard to process corner variations, power supply variations, and temperature variations, a switched capacitor circuit is used to tune the transconductance $G_m$ of one or more of the OTAs included within the $G_m$-C filter. In that regard, a biquad second order $G_m$-C filter such as filter 100 shown in FIG. 2 includes five different OTAs, each having their own independent transconductance (denoted as $g_{m1}$ through $g_{m5}$). In addition, filter 100 includes 3 classes of capacitors (having corresponding capacitances $C_1$ through $C_3$). The transfer function H(s) for filter 100 thus depends on the various transconductances and capacitances as given by the following equation:

$$H(s) = \frac{s^2\left[\frac{C_3}{C_3+C_2}\right] + s\left[\frac{G_{m5}}{C_3+C_2}\right] + \left[\frac{G_{m2}G_{m4}}{C_1(C_3+C_2)}\right]}{s^2 + s\left[\frac{G_{m3}}{C_3+C_2}\right] + \left[\frac{G_{m1}G_{m2}}{C_1(C_3+C_2)}\right]}. \quad (1)$$

This relatively complex behavior can be simplified as follows. Although transconductances have large variations in their absolute values, relative transconductance values can be set quite accurately by the ratio of the OTA transistor widths (provided the same channel lengths are used for all devices). Thus, an arbitrary OTA such as OTA 105 having a transconductance $g_{m1}$ may be used to define the transconductance of the remaining OTAs. For example, the transconductance $g_{m2}$ for OTA 110 may be defined as $K_{m2}g_{m1}$, the transconductance $g_{m3}$ for OTA 115 may be defined as $K_{m3}g_{m1}$, and so on. In general, the ith transconductance can be expressed in terms of the first OTA as $$G_{mi} = K_{mi}G_{m1} \quad (2)$$

Similarly, the sum of the capacitances $C_3$ and $C_2$ can be defined in terms of C1 using a constant K as $$C_3 + C_2 = KC_1 \quad (3)$$

Using equations (2) and (3), equation (1) can be simplified as follows $$H(s) = \frac{s^2\left[\frac{C_3}{C_3+C_2}\right] + s\left(\frac{K_{m5}}{K}\right)\left(\frac{G_{m1}}{C_1}\right) + \left(\frac{K_{m2}K_{m4}}{K}\right)\left(\frac{G_{m1}}{C_1}\right)^2}{s^2 + s\left(\frac{K_{m3}}{K}\right)\left(\frac{G_{m1}}{C_1}\right) + \left(\frac{K_{m1}K_{m2}}{K}\right)\left(\frac{G_{m1}}{C_1}\right)^2}. \quad (4)$$

From equation (4), it can be seen that if just the ratio of Gm1/C1 is tuned to be self-compensating with regard to variations in power supply, process corner, and temperature, then the remaining transconductance/capacitance ratios need no tuning since these ratios can be conventionally manufactured to an accuracy of approximately one percent.

Figure 1A:
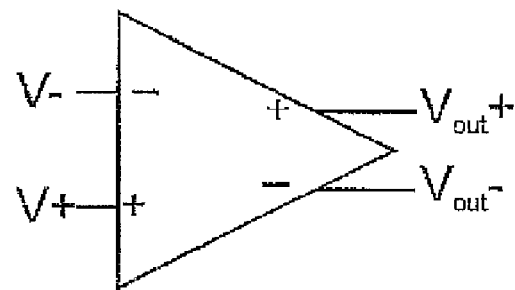
FIG. 1a is a schematic diagram of an operational transconductance amplifier (OTA).
Figure 1B:
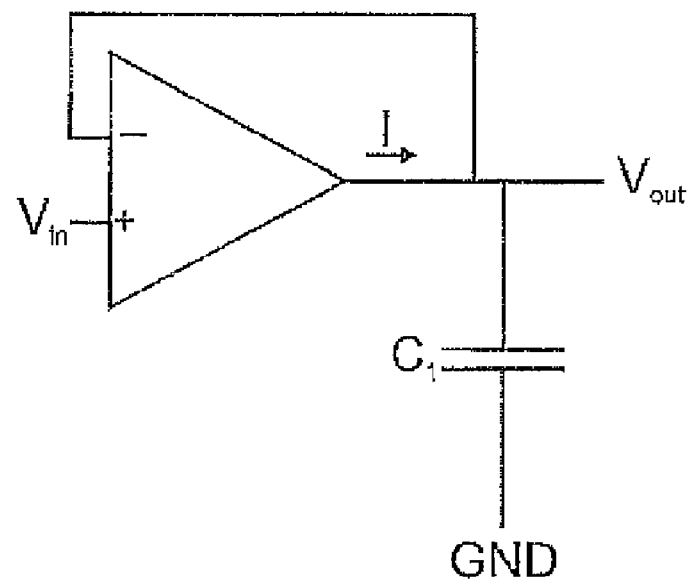
FIG. 1b is a schematic diagram of a conventional transconductance-capacitance ($G_m$-C) filter.
Figure 3:
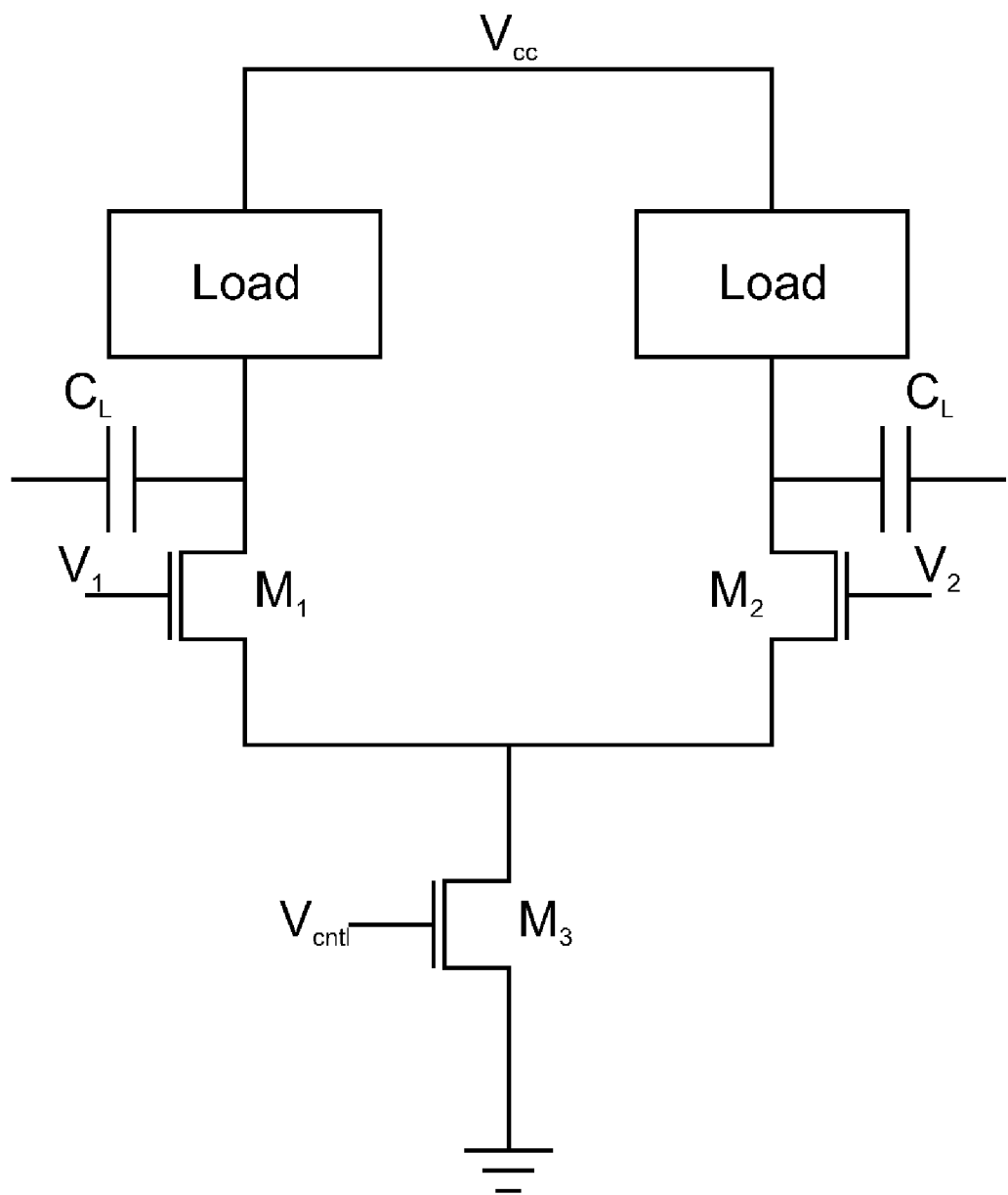
FIG. 3 is a circuit diagram of a differential amplifier within an OTA in the filter of FIG. 2.

Although the above simplification was described with regard to the biquad filter 100 of FIG. 1, it can be shown that any order (nth order) of $G_m$-C filters can be tuned in this fashion. In other words, a single one of the OTAs may be self-compensated as discussed further herein yet the entire $G_m$-C filter will be self-compensated. This self-compensation may be better understood with reference to the transistor differential pair within each OTA. An example differential pair of matched transistors M1 and M2 is shown in FIG. 3. The tail current from transistor M1 and M3 is biased by a control voltage $V_{cntl}$ driving the gate of a transistor M3. Matched transistors M1 and M2 each have a transconductance of $G_m$ whereas M3 is sized to have a transconductance of $AG_m$.

Figure 4A:
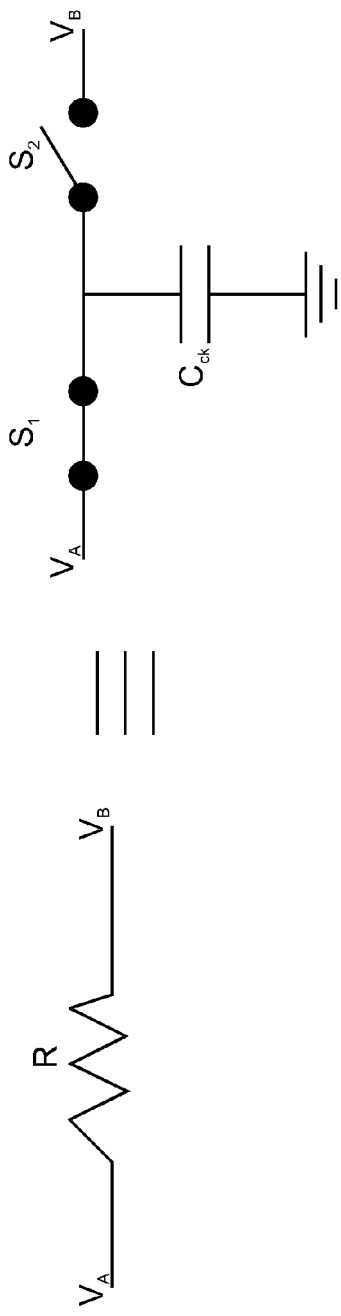
FIG. 4a is a circuit diagram illustrating the equivalence of a switched capacitor circuit to a resistor.

The following discussion will show how to generate the bias voltage $V_{cntl}$ such that the ratio of $G_m/C_L$ for the OTA is self-compensating. This self compensation will rely on the use of a switched capacitor circuit to produce a desired resistance. As known from Ohm's law, a voltage potential $V_A - V_B$ applied across a resistor of resistance R will produce a current I equaling $(V_A - V_B)/R$. However, as seen in FIG. 4a, the same amount of charge can be moved between these voltage potentials using a switched capacitor circuit 400 that couples voltage $V_A$ to a capacitor having a capacitance $C_{ck}$ through a switch $S_1$. Similarly, the capacitor couples to voltage $V_B$ through a switch $S_2$. If switched $S_1$ is driven on and off by a clock of frequency $f_{ck}$ while switch $S_2$ is driven by the complement of this clock, it can be shown that a current I flowing through the capacitor will equal $f_{ck}C_{ck}(V_A - V_B)$. Thus, the switched capacitor circuit functions as a resistor having a resistance $R_m$ of $$R_m = 1/f_{ck}C_{ck} \quad (5)$$

Figure 4B:
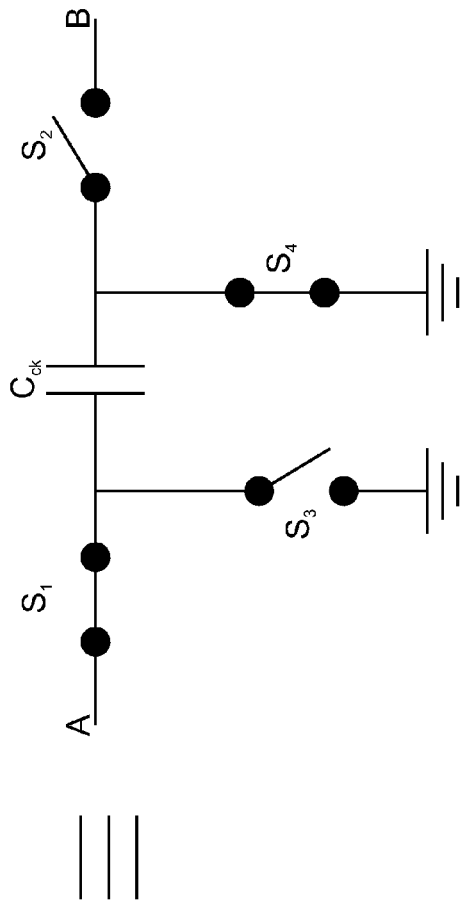
FIG. 4b is a circuit diagram of a switched capacitor circuit adapted for greater robustness to parasitic effects.

The equivalence of a switched capacitor circuit to provide a desired resistance is made more precise by using the additional switches $S_3$ and $S_4$ as shown in FIG. 4b for a switched capacitor circuit 405 in that the additional switches make the circuit parasitic insensitive. $S_1$ and $S_4$ are driven by the clock whereas $S_2$ and $S_3$ are driven by the complement of the clock.

Figure 5:
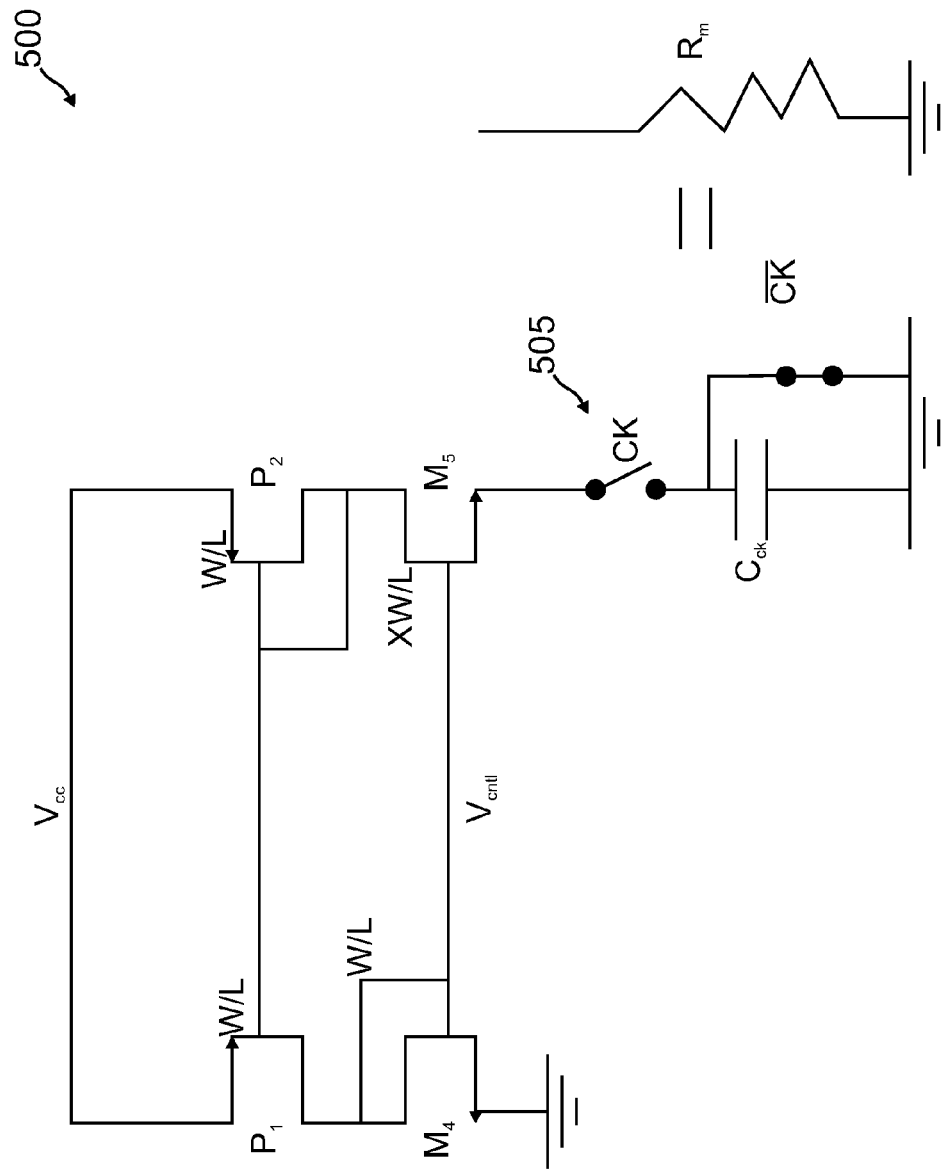
FIG. 5 is a circuit diagram for a bias circuit to provide the control voltage applied in the circuit of FIG. 3.

The incorporation of a switched capacitor circuit into a bias circuit 500 as shown in FIG. 5 for the generation of the control voltage $V_{cntl}$ will now be discussed. A pair of PMOS transistors $P_1$ and $P_2$ form a current mirror. Thus, if $P_1$ and $P_2$ are matched (same width W and length L and thus the same W/L ratio), they will each source the same current I. Thus, a current I flows through an NMOS transistor $M_4$ and an NMOS transistor $M_5$. M4 is diode connected between the drain of a PMOS transistor $P_1$ and ground so as to be in saturation mode. Transistor $M_4$ is matched to $M_3$ of FIG. 3. The gate of $M_4$ is tied to the gate of transistor $M_5$, where $M_5$ is larger than $M_4$. If $M_5$ has the same length L as does $M_4$, then the width of $M_5$ is a factor X times larger than a width W for $M_4$. The sources of both $P_1$ and $P_2$ are driven by a power supply voltage node $V_{CC}$. The source of $M_5$ couples to ground through a switched capacitor circuit 505 that functions to provide a resistance of $R_m$. It can be shown that the transconductance $g_{m4}$ for $M_4$ can be expressed as $$g_{m4} = 2/R_m(1 - 1/\mathrm{Sqrt}(X)) \quad (6)$$

Substitution of equation (5) into equation (6) allows the transconductance to be expressed as $$g_{m4} = 2(1 - 1/\mathrm{Sqrt}(X))f_{ck}C_{ck} \quad (7)$$

It will be appreciated that the switched capacitor circuit 505 may be made more robust as discussed with regard to FIG. 4b. Examination of equation (7) shows that the transconductance dependence on the width X is such that by making X sufficiently large, the necessary clock frequency for driving the switched capacitor circuit is reduced. This is a substantial advantage over other techniques used to make $G_m$-C filters more robust to variations in power supply voltage (input noise), process corners, and temperature.

Referring back to FIG. 3, one can see that if the transconductance of $M_3$ is controlled by the control voltage $V_{cntl}$ generated as discussed with regard to FIG. 5, the ratio of $G_m/C_L$ for the OTA/capacitor combination including such a differential pair can be expressed as $$G_m/C_L = 2A(1 - 1/\mathrm{Sqrt}(X))f_{ck}C_{ck}/C_L \quad (8)$$

Referring again to FIG. 2, suppose that the OTAs were all matched in the sense of having matched differential pairs of transistors as discussed with regard to FIG. 3. It has already been shown with regard to equation (4) that if just one of the transconductances is tuned, then the overall $G_m$-C for the filter is established. As seen by equation (8), the filter coefficients will depend only on the ratio of device parameters and capacitances. This is quite advantageous as the resulting filter coefficients will be independent of process and temperature variations as well as power supply noise. For example, a fast process corner will affect $C_{ck}$ equally as it does affect $C_L$. Thus, the ratio of capacitances cancels out process corner variations. The same argument applies to temperature and power supply noise. Moreover, although this self compensation of a $G_m$-C filter has been discussed with regard to the biquad filter 100 of FIG. 2, the same self-compensation can be applied to any nth order $G_m$-C filter.

It will be obvious to those skilled in the art that various changes and modifications may be made without departing from this invention in its broader aspects. The appended claims encompass all such changes and modifications as fall within the true spirit and scope of this invention.

I claim:

1. A transconductance-capacitance ($G_m$-C) filter, comprising:
   a plurality of operational transconductance amplifiers (OTAs), wherein each OTA includes a differential pair of transistors providing a tail current to a third transistor having a transconductance $g_m$, and
   a bias circuit for biasing a gate of a given one of the third transistors with a control voltage, the bias circuit including a switched capacitor circuit such that a transfer function for the $G_m$-C filter is proportional to a ratio of capacitances and is independent of process corner variations, wherein the bias circuit includes a fourth transistor matched to the given third transistor and a fifth transistor that has a width-to-length ratio that is a factor X times larger than a width-to-length ratio for the fourth transistor, and wherein the switched capacitor circuit is coupled between a source for the fifth transistor and ground.

2. The $G_m$-C filter of claim 1, wherein the transfer function for the $G_m$-C filter is independent of temperature variations.

3. The $G_m$-C filter of claim 1, wherein the transfer function for the $G_m$-C filter is independent of power supply noise.

4. The $G_m$-C filter of claim 1, wherein the bias circuit further comprises a first PMOS transistor, wherein the fourth transistor is a diode-connected NMOS transistor coupled between a drain of the first PMOS transistor and ground, and wherein the fourth transistor has a gate coupled to a gate of the fifth transistor.

5. The $G_m$-C filter of claim 4, wherein the bias circuit further comprises a second diode-connected PMOS transistor, wherein the a drain of the second PMOS transistor couples to a drain of the fifth transistor and wherein a gate of the first PMOS transistor couples to a gate of the second PMOS transistor.

6. The $G_m$-C filter of claim 5, wherein a source for each of the first and second PMOS transistors couples to a power supply voltage node.

7. The $G_m$-C filter of claim 6, wherein the control voltage equals a gate voltage for the fourth transistor.

8. A transconductance-capacitance ($G_m$-C) filter, comprising
   a plurality of operational transconductance amplifiers (OTAs), wherein a first one of the OTAs has a first transconductance and the remaining ones of the OTAs have transconductances that are proportional to the first transconductance, and
   a bias circuit for biasing the first transconductance to a desired value responsive to a clock frequency, the bias circuit including a switched capacitor circuit generating a resistance inversely proportional to the clock frequency, wherein the desired transconductance value is proportional to the clock frequency, wherein the first OTA includes a first transistor having a gate driven by a bias voltage produced by the bias circuit, and wherein the bias circuit includes a second transistor having a width-to-length ratio that is a factor X times larger than a width-to-length ratio of the first transistor, and wherein the desired transconductance value is proportional to a factor of $(1-1/X^{1/2})$.

9. The $G_m$-C filter of claim 8, wherein the $G_m$-C filter is a biquad filter.

* * * * *